US012590224B2

(12) United States Patent
Liang et al.

(10) Patent No.: US 12,590,224 B2
(45) Date of Patent: Mar. 31, 2026

(54) CHEMICAL MECHANICAL POLISHING COMPOSITIONS AND METHODS OF USE THEREOF

(71) Applicant: FUJIFILM ELECTRONIC MATERIALS U.S.A., INC., North Kingstown, RI (US)

(72) Inventors: Yannan Liang, Gilbert, AZ (US); Bin Hu, Chandler, AZ (US); Ting-Kai Huang, Tainan (TW); Shu-Wei Chang, Taoyuan District (TW); Liqing (Richard) Wen, Mesa, AZ (US)

(73) Assignee: FUJIFILM Electronic Materials U.S.A., Inc., North Kingstown, RI (US)

( * ) Notice: Subject to any disclaimer, the term of this patent is extended or adjusted under 35 U.S.C. 154(b) by 904 days.

(21) Appl. No.: 17/547,352

(22) Filed: Dec. 10, 2021

(65) Prior Publication Data

US 2022/0195241 A1      Jun. 23, 2022

Related U.S. Application Data

(60) Provisional application No. 63/128,412, filed on Dec. 21, 2020.

(51) Int. Cl.
*C09G 1/02* (2006.01)
*H10P 52/40* (2026.01)

(52) U.S. Cl.
CPC .............. *C09G 1/02* (2013.01); *H10P 52/402* (2026.01)

(58) Field of Classification Search
CPC ............................ C09G 1/02; H01L 21/30625
See application file for complete search history.

(56) References Cited

U.S. PATENT DOCUMENTS

| | | |
|---|---|---|
| 9,567,491 B2 | 2/2017 | Lin et al. |
| 10,676,646 B2 | 6/2020 | Liang et al. |
| 10,947,413 B2 | 3/2021 | Theivanayagam |

| | | | |
|---|---|---|---|
| 2007/0128872 A1* | 6/2007 | Itoh ........................... | C23F 1/18 |
| | | | 257/E21.583 |
| 2009/0093118 A1 | 4/2009 | Uotani et al. | |
| 2016/0107289 A1* | 4/2016 | Cavanaugh ............. | C23F 11/10 |
| | | | 252/79.1 |
| 2016/0108284 A1 | 4/2016 | Yoshizaki | |
| 2016/0189976 A1 | 6/2016 | Wang et al. | |
| 2019/0300749 A1* | 10/2019 | Lin ........................... | C09G 1/02 |
| 2020/0263056 A1 | 8/2020 | Akaji et al. | |
| 2020/0308445 A1* | 10/2020 | Theivanayagam ... | B24B 37/044 |
| 2021/0301177 A1* | 9/2021 | McDonough ........... | C09G 1/02 |

FOREIGN PATENT DOCUMENTS

| | | |
|---|---|---|
| CN | 106661430 A | 5/2017 |
| CN | 108929633 A | 12/2018 |
| CN | 111745532 A | 10/2020 |

OTHER PUBLICATIONS

Chinese Office Action dated Oct. 25, 2024 for Chinese Application No. 202111562413.5.
International Search Report dated Apr. 18, 2022 for PCT Appl. No. PCT/US2021/062740.
Written Opinion dated Apr. 18, 2022 for PCT Appl. No. PCT/US2021/062740.
International Preliminary Report on Patentability (IPRP) Search Report dated Jun. 29, 2023 for PCT Appl. No. PCT/US2021/062740.

* cited by examiner

*Primary Examiner* — Alexandra M Moore

(74) *Attorney, Agent, or Firm* — Ohlandt, Greeley and Perle, LLP.

(57)          ABSTRACT

A polishing composition includes at least one abrasive, at least one organic acid, at least one anionic surfactant comprising at least a phosphate, at least one phosphonic acid compound having a molecular weight below 500 g/mol, at least one azole containing compound, at least one alkylamine compound having a 6-24 carbon alkyl chain, and an aqueous solvent, and optionally, a pH adjuster.

13 Claims, No Drawings

CHEMICAL MECHANICAL POLISHING COMPOSITIONS AND METHODS OF USE THEREOF

CROSS-REFERENCE TO RELATED APPLICATION

The present application claims the benefit under 35 U.S.C. § 119 of United States Provisional Patent Application Ser. No. 63/128,412, filed on Dec. 21, 2020, which is herein incorporated by reference.

BACKGROUND OF THE DISCLOSURE

1. Field of the Disclosure

The present disclosure relates to chemical mechanical polishing compositions. In particular, the present disclosure relates to polishing compositions that balances required polishing performance characteristics of cobalt and other substances used in the field.

2. Description of the Related Art

The semiconductor industry is continually driven to improve chip performance by further miniaturization of devices by process, materials, and integration innovations. Earlier materials innovations included the introduction of copper, replacing aluminum as the conductive material in the interconnect structure, and the use of tantalum (Ta)/tantalum nitride (TaN) (or titanium (Ti)/titanium nitride (TiN)) as diffusion barrier to separate the Cu conductive material from the non-conductive/insulator dielectric material. Copper (Cu) was chosen as the interconnect material because of its low resistivity and superior resistance against electro-migration.

However, as the features of newer generation chips shrink, the multilayer Cu/barrier/dielectric stacks have to be thinner and more conformal to maintain effective interconnect resistivity in Back End of Line (BEOL). The thinner Cu and the Ta/TaN barrier film schemes present problems with resistivity and flexibility in deposition. For example, with smaller dimensions and advanced manufacturing nodes, resistivity is proceeding to be exponentially worse and improvements in transistor circuit speed (at Front End of Line (FEOL)) are being cut in half by the delay coming from the conductive Cu/Barrier wiring (BEOL). Cobalt (Co) has emerged as a leading candidate for use as a liner material, a barrier layer, as well as a conductive layer. Furthermore, cobalt is also being investigated as a replacement for tungsten (W) metal in multiple applications such as W metal contacts, plugs, vias, and gate materials.

Many currently available CMP slurries were specifically designed to remove materials more common in older chip designs, such as the aforementioned copper and tungsten. Certain components in these older CMP slurries may cause deleterious and unacceptable defects in cobalt, since cobalt is more susceptible to chemical corrosion. As a result, when using copper polishing slurries on cobalt layers, unacceptable corrosion, wafer topography, and removal rate selectivity often occur.

While cobalt is still used in conjunction with other metals (e.g., Cu and/or W), with the increasing use of cobalt (Co) as a metal component in semiconductor fabrication, there is a market need for CMP slurries that can effectively polish a dielectric component or a barrier component on Co-containing surfaces without significant metal corrosion.

SUMMARY OF THE DISCLOSURE

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of the chemical mechanical polishing composition. In addition, all stated ranges include the disclosed range and any subranges thereof. For example, a range of "from 0.1% to 1% by weight" includes the range 0.1-1, as well as any subranges thereof, such as 0.2-0.9, 0.5-1, 0.1-0.5, etc. A range of "6 to 24 carbons" includes 6-24 carbons, 8-20 carbons, 6-12 carbons, 10-24 carbons, etc.

In one aspect, the present disclosure provides polishing compositions including at least one abrasive, at least one organic acid, at least one anionic surfactant comprising at least a phosphate, at least one phosphonic acid compound having a molecular weight below 500 g/mol, at least one azole containing compound, at least one alkylamine compound having a 6-24 carbon alkyl chain, and an aqueous solvent, and optionally, a pH adjuster.

In another aspect, the present disclosure provides a polishing composition comprising: at least one abrasive in an amount of from about 0.01% to about 25% by weight of the composition; at least two organic acids, in an amount of from about 0.001% to about 2.5% by weight of the composition, wherein at least one of the organic acids is an amino acid; at least one anionic surfactant comprising at least a phosphate, and at least one of a hydrophobic 6 to 24 carbon alkyl chain and 2 to 16 ethylene oxide groups, wherein the anionic surfactant is in an amount of from about 0.001% to about 0.5% by weight of the composition; at least one phosphonic acid compound having a molecular weight below 500 g/mol in an amount of from about 0.01% to about 1.5% by weight of the composition; at least one azole containing compound in an amount of from about 0.001% to about 0.5% by weight of the composition; at least one alkylamine compound having a 6-24 carbon alkyl chain in an amount of from about 0.0005% to about 0.5% by weight of the composition; and an aqueous solvent, wherein the pH of the composition is between about 7 to about 12.

In another aspect, embodiments disclosed herein relate to methods of polishing substrates using the polishing compositions described herein.

Other aspects and advantages of the claimed subject matter will be apparent from the following description and the appended claims.

DETAILED DESCRIPTION OF THE DISCLOSURE

Embodiments disclosed herein relate generally to compositions and methods of using said compositions to polish substrates that include at least a cobalt portion and a tungsten portion. Further, embodiments disclosed herein related to compositions and methods of using said compositions to polish substrates that include at least cobalt, tungsten, and dielectric (TEOS, SiN, low-k, etc.) portions.

The present disclosure provides a composition that provides desired and improved cobalt and tungsten corrosion resistance. In addition, the compositions of the present disclosure provide the ability to tune cobalt, tungsten, TEOS, and dielectric removal rates as compared to currently available slurries. The cobalt and tungsten removal rates can be controlled so that they are higher or lower than the TEOS and dielectric removal rates as needed. The compositions comprise an advantageous combination of at least one anionic surfactant comprising at least a phosphate, at least one phosphonic acid compound having a molecular weight below 500 g/mol, and at least one alkylamine compound having a 6-24 carbon alkyl chain, along with other components. As discussed in greater detail below, the combination of these three components provides results relating to the polishing of cobalt and tungsten that could not be expected based on the performance of each component individually.

With the introduction of cobalt (Co) as a barrier layer, conductive layer, and/or W replacement, there is a market need for CMP slurries that can polish Co at effective material removal rates without experiencing significant Co corrosion (i.e., having a moderate Co removal rate) and have a range of selectivities in polishing rates of other metals and metal nitrides or oxides (Cu, W, Ti, TiN, Ta TaN, Ta$_2$O$_5$, TiO$_2$, Ru, ZrO$_2$, HfO$_2$, etc.), and dielectric films (SiN, silicon oxide, Poly-Si, low k dielectrics (e.g., carbon doped silicon oxides), etc.). For example, after an aggressive bulk polishing step where large amounts of materials are removed, it is often desirable to perform a buffing polish step in order to obtain the desired surface topography. In some embodiments, the composition used for the buffing polish will remove dielectric materials and metals (e.g., TEOS, SiN, and Co) at a lower rate than what occurs during a bulk polishing step or at approximately the same removal rate for each component (e.g., within 10% or within 5%) in order to obtain the desired surface topography. Because Co is more chemically reactive than Cu and other noble metals, Co corrosion prevention is very challenging in advanced node polishing composition design. Current metal polishing slurries are ill-equipped to polish surfaces that include Co as they suffer from Co corrosion issues during the CMP process. In addition, it is generally desirable to remove a certain amount of Co during polishing to form a smooth surface in a patterned semiconductor substrate for subsequent manufacturing processes.

Further, advanced nodes often utilize substrates with multiple metals (e.g., Co and W), thus, considerations must also be made when formulating a polishing composition to prevent excessive corrosion of each metal. Corrosion occurs to different degrees for each metal when they are placed in the same chemical environment. For example, generally cobalt is more easily corroded under low pH conditions than tungsten and the opposite is true under high pH conditions. Similar considerations are also applicable for chemical additives (i.e., some chemical additives potentially corrode, or prevent corrosion, one metal more than a different metal).

In one or more embodiments, the polishing composition of the present disclosure includes: at least one abrasive; at least one organic acid; at least one anionic surfactant comprising at least a phosphate; at least one phosphonic acid compound having a molecular weight below 500 g/mol; at least one azole containing compound; at least one alkylamine compound having a 6-24 carbon alkyl chain; an aqueous solvent; and optionally a pH adjuster.

In one or more embodiments, a polishing composition according to the present disclosure can include: from about 0.1% to about 25% by weight of abrasive; about 0.001% to about 2.5% by weight of organic acid; about 0.001% to about 0.5% by weight anionic surfactant comprising at least a phosphate; about 0.01% to about 1.5% by weight phosphonic acid compound having a molecular weight below 500 g/mol; about 0.001% to about 0.5% by weight azole containing compound; about 0.0005% to about 0.5% by weight alkylamine compound having a 6-24 carbon allyl chain; and the remaining percent (e.g., about 70-99% by weight) of an aqueous solvent.

In one or more embodiments, the present disclosure provides a concentrated polishing composition that can be diluted with water prior to use by up to a factor of two, or up to a factor of three, or up to a factor of four, or up to a factor of six, or up to a factor of eight, or up to a factor of ten. In other embodiments, the present disclosure provides a point-of-use (POU) polishing composition for use on cobalt and tungsten containing substrates, comprising the above-described polishing composition, water, and optionally an oxidizer.

In one or more embodiments, a POU polishing composition according to the present disclosure can include: from about 0.10% to about 12% by weight of abrasive; about 0.001% to about 1% by weight of organic acid; about 0.001% to about 0.1% by weight anionic surfactant comprising at least a phosphate; about 0.010% to about 0.5% by weight phosphonic acid compound having a molecular weight below 500 g/mol; about 0.001% to about 0.1% by weight azole containing compound; about 0.0005% to about 0.05% by weight alkylamine compound having a 6-24 carbon alkyl chain; and the remaining percent (e.g., about 70-99% by weight) of an aqueous solvent.

In one or more embodiments, a concentrated polishing composition according to the present disclosure can include: from about 1% to about 25% by weight of abrasive; about 0.01% to about 2.5% by weight of organic acid; about 0.01% to about 0.5% by weight anionic surfactant comprising at least a phosphate; about 0.1% to about 1.5% by weight phosphonic acid compound having a molecular weight below 500 g/mol; about 0.01% to about 0.5% by weight azole containing compound; about 0.005% to about 0.5% by weight alkylamine compound having a 6-24 carbon alkyl chain; and the remaining percent (e.g., about 70-99% by weight) of an aqueous solvent.

In one or more embodiments, the at least one (e.g., two or three) abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%), based on the total weight of the POU polishing composition, or any subranges thereof.

In one or more embodiments, the abrasive is a silica-based abrasive, such as one selected from the group consisting of colloidal silica, fumed silica, and mixtures thereof. In one or more embodiments, the abrasive can be surface modified with organic groups and/or non-siliceous inorganic groups. For example, the cationic abrasive can include terminal groups of formula (I):

$$-O_m-X-(CH_2)_n-Y \qquad (I),$$

in which m is an integer from 1 to 3; n is an integer from 1 to 10; X is Al, Si, Ti, Ce, or Zr; and Y is a cationic amino or thiol group. As another example, the anionic abrasive can include terminal groups of formula (I):

$$-O_m-X-(CH_2)_n-Y \qquad (I),$$

in which m is an integer from 1 to 3; n is an integer from 1 to 10; X is Al, Si, Ti, Ce, or Zr; and Y is an acid group.

In one or more embodiments, the abrasive described herein can have a mean particle size of from at least about 1 nm (e.g., at least about 5 m, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, or at most about 200 nm). As used herein, the mean particle size (MPS) is determined by dynamic light scattering techniques.

In some embodiments, the at least one abrasive is present in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 25% (e.g., at most about 20%, at most about 18, at most about 15%, at most about 12%, at most about 10%, or at most about 5%) by weight of the polishing composition described herein.

In one or more embodiments, the polishing composition includes at least one organic acid. In one or more embodiments, the organic acid (or salts thereof) may be selected from the group consisting of a carboxylic acid, an amino acid, a sulfonic acid, a phosphonic acid or mixtures thereof. In some embodiments, the organic acid can be a carboxylic acid that includes one or more (e.g., two, three, or four) carboxylic acid groups, such as a dicarboxylic acid or a tricarboxylic acid. In some embodiments, the organic acid may be an amino acid including a carboxylic acid group. In one or more embodiments, the organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, maleic acid, nitrilotriacetic acid, ethylenediaminetetraacetic acid, diethylenetriaminepentaacetic acid, alanine, histidine, valine, phenylalanine, proline, glutamine, aspartic acid, glutamic acid, arginine, lysine, tyrosine, glycine, serine, asparagine, cysteine, leucine, isoleucine, methionine, threonine, tryptophan, benzoic acid, and mixtures thereof. In one or more embodiments, the polishing composition includes at least two organic acids and one is an amino acid. Without wishing to be bound by theory, it is surprising that an organic acid or an amino acid (such as those described above) can be used as an effective barrier layer and/or cobalt removal rate enhancer in the polishing composition described herein to improve the removal rate of a barrier film and/or cobalt film in a semiconductor substrate.

In some embodiments, the at least one organic acid is in an amount of from at least about 0.001% (e.g., at least about 0.003%, at least about 0.005%, at least about 0.01%, at least about 0.03%, at least about 0.05%, at least about 0.1%, at least about 0.3%, at least about 0.5%, at least about 1%, at least about 1.3%, or at least about 1.5%) by weight to at most about 2.5% (e.g., at most about 2.2%, at most about 2%, at most about 1.7%, at most about 1.5%, at most about 1.2%, at most about 1%, at most about 0.7%, at most about 0.5%, at most about 0.2%, at most about 0.15%, at most about 0.1%, at most about 0.07%, or at most about 0.05%) by weight of the polishing composition described herein. In embodiments where more than one organic acid is included in the composition, the above ranges may apply to each organic acid independently, or to the combined amount of organic acid within the polishing composition.

In one or more embodiments, the anionic surfactant comprises one or more phosphate groups and one or more of the following groups: a six to twenty four carbon alkyl chain, from zero to eighteen ethylene oxide groups, or a combination thereof. In one or more embodiments, the alkyl chain can have at least eight carbons, at least ten carbons, at least twelve carbons, or at least fourteen carbons. In one or more embodiments, the alkyl chain can have at most 22 carbons, or at most 20 carbons, or at most 18 carbons. Without wishing to be bound by theory, it is surprising that an anionic surfactant (such as those described above) can function as a cobalt corrosion inhibitor in the polishing composition described herein to reduce or minimize the removal rate of cobalt in a semiconductor substrate.

In some embodiments, the anionic surfactant is in an amount of from at least about 0.001% (e.g., at least about 0.002%, at least about 0.005%, at least about 0.01%, at least about 0.02%, at least about 0.05%, at least about 0.1%, or at least about 0.2%) by weight to at most about 0.5% (e.g., at most about 0.4%, at most about 0.2%, at most about 0.1%, at most about 0.08%, at most about 0.05%, at most about 0.02%, at most about 0.0075%, or at most about 0.005%) by weight of the polishing composition described herein.

In one or more embodiments, the phosphonic acid is selected from the group consisting of phenylphosphonic acid, butylphosphonic acid, hexylphosphonic acid, octylphosphonic acid, decylphosphonic acid, dodecylphosphonic acid, tetradecylphosphonic acid, hexadecylphosphonic acid, octadecylphosphonic acid, benzylphosphonic acid, phenylethylphosphonic acid, phenylpropylphosphonic acid, phenylbutylphosphonic acid, and mixtures thereof. Without wishing to be bound by theory, it is surprising that the phosphonic acids described above can reduce or minimize the corrosion of cobalt in a semiconductor substrate. Further, it is surprising that the anionic surfactant and the phosphonic acid exhibit a synergistic benefit of reducing TEOS edge of erosion (EoE) when polishing compositions according to the present disclosure are used to polish patterned wafers. This synergism is explained in more detail in the Examples presented at the end of this disclosure. In one or more embodiments, the weight percent ratio between the phosphonic acid and the anionic surfactant (i.e., weight % phosphonic acid:weight % anionic surfactant) should be between about 5:1 to 100:1. For example, the ratio may be at least 10:1, at least 15:1, at least 20:1, at least 25:1, at least 30:1, at least 35:1, at least 40:1, at least 45:1, or at least 50:1 to at most 95:1, at most 90:1, at most 85:1, at most 80:1, at most 75:1, at most 70:1, at most 65:1, at most 60:1, or at most 55:1.

In some embodiments, the phosphonic acid is in an amount of from at least about 0.01% (e.g., at least about 0.05%, at least about 0.075%, at least about 0.1%, at least about 0.25%, at least about 0.5%, at least about 0.75%, or at least about 1%) by weight to at most about 1.5% (e.g., at most about 1.25%, at most about 1%, at most about 0.75% at most about 0.5%, at most about 0.25%, at most about 0.1%, or at most 0.075%) by weight of the polishing composition described herein.

In one or more embodiments, the at least one azole is selected from the group consisting of tetrazole, benzotriazole, adenine, benzimidazole, thiabendazole, tolyltriazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, 5-methylbenzotriazole, 5-chlorobenzotriazole, 5-fluorobenzotriazole, 5-bromobenzotriazole, 5-iodobenzotriazole, 5-aminotetrazole, 5-ethylbenzotriazole, 5-butylbenzotriazole, dimethylbenzotriazole, dichlorobenzotriazole, chloromethylbenzotriazole, phenylbenzotriazole, benzylbenzotriazole, nitrobenzotriazole, imidazole, and combinations thereof. Without wishing to be bound by theory, it is surprising that an azole-containing corrosion inhibitor (such as those described above) can significantly reduce or minimize the removal rate of copper (or other metals) in a semiconductor substrate.

In some embodiments, the at least one azole is in an amount of from at least about 0.001% (e.g., at least about 0.002%, at least about 0.005%, at least about 0.01%, at least about 0.02%, at least about 0.05%, at least about 0.1%, or at least about 0.2%) by weight to at most about 0.5% (e.g., at most about 0.4%, at most about 0.2%, at most about 0.1%, at most about 0.08%, at most about 0.05%, at most about 0.02%, at most about 0.0075%, or at most about 0.005%) by weight of the polishing composition described herein.

In some embodiments, the at least one alkylamine compound has at least one (e.g., two or three) alkyl chain that includes between 6 and 24 (i.e., 6, 7, 8, 9, 10, 11, 12, 13, 14, 15, 16, 17, 18, 19, 20, 21, 22, 23, or 24) carbons. In one or more embodiments, the alkyl chain can be a linear, branched, or cyclic alkyl group. In one or more embodiments, the alkylamine compound can be a primary, secondary, tertiary, or cyclic compound. In one or more embodiments, the alkylamine compound can be an alkoxylated amine (e.g., include ethoxylate and/or propoxylate groups). In one or more embodiments, the alkoxylated amine can include from 2 to 100 ethoxylate and/or propoxylate groups. In some embodiments, the at least one alkylamine compound has an alkyl chain that includes between 6 and 18 carbons. In some embodiments, the alkylamine is selected from the group consisting of hexylamine, octylamine, decylamine, dodecylamine, tetradecylamine, pentadecylamine, hexadecylamine, octadecylamine, cyclohexylamine, dicyclohexylamine, dipropylamine, or mixtures thereof. Without wishing to be bound by theory, it is surprising that the alkylamine compounds described above can significantly reduce or minimize the corrosion of tungsten in a semiconductor substrate.

In some embodiments, the at least one alkylamine compound is in an amount of from at least about 0.0005% (e.g., at least about 0.001%, at least about 0.002%, at least about 0.005%, at least about 0.01%, at least about 0.02%, at least about 0.05%, at least about 0.1%, or at least about 0.2%) by weight to at most about 0.5% (e.g., at most about 0.4%, at most about 0.2%, at most about 0.1%, at most about 0.08%, at most about 0.05%, at most about 0.02%, at most about 0.0075%, or at most about 0.005%) by weight of the polishing composition described herein.

In some embodiments, a polishing composition may optionally include an amine compound distinct from the alkylamine compound or the amino acids mentioned previously. For example, a polishing composition may optionally include an amine compound selected from the group consisting of monoethanolamine, 2-(2-aminoethoxy)ethanol, 3-methoxypropylamine, tris(hydroxymethyl)aminomethane, diethanolamine, 1-(2-hydroxyethyl)piperazine, 2,2,6,6-tetramethylpiperidine, 1-(o-tolyl)biguanide, 1,3-di-o-tolvlguanidine, N-methyleth anolamine, pentamethyldiethylenetriamine, aminopropylmethylethanolamine, morpholine, piperazine, morpholinopropylamine, cyclohexylamine, dicyclohexylamine, aminoethylenepiperazine, or mixtures thereof. Without wishing to be bound by theory, it is surprising that the optional amine compounds described above can significantly reduce or minimize the corrosion of tungsten in a semiconductor substrate.

In some embodiments, the optional amine compound is included in the polishing composition in an amount from at least about 0.005% (e.g., at least about 0.0075%, at least about 0.01%, at least about 0.025%, at least about 0.05%, at least about 0.1%, or at least about 0.25%) by weight to at most about 0.5% % (e.g., at most about 0.4%, at most about 0.2%, at most about 0.1%, at most about 0.08%, at most about 0.05%, at most about 0.02%, or at most about 0.0075%) by weight of the polishing composition described herein.

In one or more embodiments, a polishing composition may further include a pH adjuster. In one or more embodiments, the pH adjuster is selected from the group consisting of anunonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

In some embodiments, the at least one pH adjuster, when included in the composition, is in an amount of from at least about 0.01% (e.g., at least about 0.05%, at least about 0.1%, at least about 0.5%, at least about 1%, at least about 1.5%, at least about 2%, at least about 2.5%, at least about 4%, or at least about 4.5%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, at most about 0.2%, or at most about 0.1%) by weight of the polishing composition described herein.

In some embodiments, the pH value of the polishing composition can range from at least about 7 (e.g., at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, at most about 10, at most about 9.5, or at most about 9). Without wishing to be bound by theory, it is believed that a polishing composition having a pH lower than 7 would significantly increase cobalt removal rate and corrosion, and a polishing composition having a pH higher than 14 can affect the stability of the suspended abrasive and would significantly increase the roughness and decrease the overall quality of a film polished by such a composition. In order to obtain the desired pH, the relative concentrations of the ingredients in the polishing compositions described herein can be adjusted.

An optional oxidizer can be added when diluting a concentrated polishing composition to form a POU polishing composition. The oxidizer can be selected from the group consisting of hydrogen peroxide, ammonium persulfate, silver nitrate (AgNO3), ferric nitrates or chlorides, per acids or salts, ozone water, potassium ferricyanide, potassium dichromate, potassium iodate, potassium bromate, potassium periodate, periodic acid, vanadium trioxide, hypochlorous acid, sodium hypochlorite, potassium hypochlorite, calcium hypochlorite, magnesium hypochlorite, ferric nitrate, potassium pennanganate, other inorganic or organic peroxides, and mixtures thereof. In one embodiment, the oxidizer is hydrogen peroxide.

In some embodiments, the oxidizer is in an amount of from at least about 0.01% (e.g., at least about 0.05%, at least about 0.1%, at least about 0.2%, at least about 0.4%, at least about 0.5%, at least about 1%, at least about 1.5%, at least about 2%, at least about 2.5%, at least about 3%, at least about 3.5%, at least about 4%, or at least about 4.5%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, the oxidizer may reduce the shelf life of a polishing composition. In such embodiments, the oxidizer can be added to the polish composition at the point of use (e.g., right before polishing).

In some embodiments, the polishing composition described herein can include a solvent (e.g., a primary solvent), such as water. In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing composition described herein.

In one or more embodiments, an optional secondary solvent (e.g., an organic solvent) can be used in the polish composition (e.g., the POU or concentrated polishing composition) of the present disclosure, which can help with the dissolution of the azole-containing corrosion inhibitor. In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, and ethylene glycol.

In some embodiments, the secondary solvent is in an amount of from at least about 0.005% (e.g., at least about 0.01%, at least about 0.02%, at least about 0.05%, at least about 0.1%, at least about 0.2%, at least about 0.4%, at least about 0.6%, at least about 0.8%, at least about 1%, at least about 3%, at least about 5%, or at least about 10%) by weight to at most about 15% (e.g., at most about 12%, at most about 10%, at most about 5%, at most about 3%, at most about 2%, at most about 1%, at most about 0.8%, at most about 0.6%, at most about 0.5%, or at most about 0.1%) by weight of the polishing composition described herein.

In one or more embodiments, the polishing composition described herein can be substantially free of one or more of certain ingredients, such as organic solvents, pH adjusting agents (e.g., di- or tri-carboxylic acids), quaternary ammonium compounds (e.g., salts or hydroxides), amines, alkali bases (such as alkali hydroxides), fluorine containing compounds (e.g., fluoride compounds or fluorinated compounds (such as polymers/surfactants)), silicon-containing compounds such as silanes (e.g., alkoxysilanes), imines (e.g., amidines such as 1,8-diazabicyclo[5.4.0]-7-undecene (DBU) and 1,5-diazabicyclo[4.3.0]non-5-ene (DBN)), salts (e.g., halide salts or metal salts), polymers (e.g., cationic or anionic polymers), surfactants (e.g., cationic surfactants, anionic surfactants, or non-ionic surfactants), plasticizers, oxidizing agents (e.g., $H_2O_2$ or periodic acid), corrosion inhibitors (e.g., azole or non-azole corrosion inhibitors), electrolytes (e.g., polyelectrolytes), and/or certain abrasives (e.g., ceria abrasives, non-ionic abrasives, surface modified abrasives, or negatively/positively charged abrasive). The halide salts that can be excluded from the polishing compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing compositions described herein can be completely free of one or more of the above ingredients.

The present disclosure also contemplates a method of using any of the above-described concentrates or POU slurries. With the concentrate, the method can comprise the steps of diluting the concentrate to form the POU polishing composition, and then contacting a substrate surface at least partially comprising cobalt with the POU polishing composition and bringing a pad (e.g., a polishing pad) into contact with the surface of the substrate and moving the pad in relation to the substrate. With the POU polishing composition, the method comprises the step of contacting the substrate surface at least partially comprising cobalt with the polishing composition and bringing a pad (e.g., a polishing pad) into contact with the surface of the substrate and moving the pad in relation to the substrate. In one or more embodiments, the surface contacted with the polishing composition may also include tungsten.

In one or more embodiments, this disclosure features a polishing method that can include applying a polishing composition according to the present disclosure to a substrate (e.g., a wafer) having at least cobalt on a surface of the substrate; and bringing a pad into contact with the surface of the substrate and moving the pad in relation to the substrate. In some embodiments, when the substrate includes at least one or more of silicon oxides (e.g., TEOS), silicon nitrides (e.g., SiN), and/or barrier materials (e.g., Ta, TaN, Ti, or TiN), the above method can remove at least a portion of these materials at about the same rate, or faster than, as it removes cobalt. For example, in one or more embodiments, polishing compositions of the present disclosure have a difference in polish rates between TEOS/SiN and Co of less than about 20%, less than about 15%, less than about 10%, or less than about 5%. In one or more embodiments, the polishing composition may have a polishing selectivity (i.e., the ratio between polishing rates) of silicon oxides (e.g., TEOS), silicon nitrides (e.g., SiN), and/or barrier materials (e.g., Ta, TaN, Ti, or TiN) to cobalt not exceeding about 1:1, not exceeding about 2:1, not exceeding about 3:1, or not exceeding about 4:1. It is to be noted that the term "silicon oxide" described herein is expressly intended to include both un-doped and doped versions of silicon oxide. For example, in one or more embodiments, the silicon oxide can be doped with at least one dopant selected from carbon, nitrogen (for silicon oxide), oxygen, hydrogen, or any other known dopants for silicon oxide. Some examples of silicon oxide film types include TEOS (tetra-ethyl orthosilicate), SiOC, SiOCN, SiOCH, SiOH and SiON. In one or more embodiments, the removal rate for cobalt provided by a polishing composition according to the present disclosure may be between about 50-500 angstroms per minute when polishing a patterned or a blanket wafer. In one or more embodiments, the removal rate for tungsten provided by a polishing composition according to the present disclosure may be between about 0-100 angstroms per minute when polishing a patterned or a blanket wafer. In one or more embodiments, the polishing composition has a static etch rate (SER) for cobalt between about 0 Å/min and 10 Å/min when a cobalt coupon is incubated in the polishing composition at 60° C. for 5 minutes. In one or more embodiments, the polishing composition has a static etch rate (SER) for tungsten between about 3 Å/min and 50 Å/min when a tungsten coupon is incubated in the polishing composition at 60° C. for 5 minutes.

In some embodiments, the method that uses a polishing composition described herein can further include producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present disclosure to its fullest extent.

EXAMPLES

The polishing was performed on an AMAT Mirra CMP polisher, a Fujibo H804 pad, a downforce pressure of 1.5 psi, a platen/head velocity of 120/114 rpm, and a polishing composition flow rate of 175 mL/min.

The general compositions used in the examples below are shown in Table 1 below. The specifics details on the differences in the compositions tested will be explained in further detail when discussing the respective examples.

TABLE 1

| Component | % By Weight of Composition |
| --- | --- |
| pH adjuster (base) | 0.01-1 |
| Organic Acid | 0.01-1 |
| Amino acid | 0.001-0.5 |
| Phosphonic Acid Compound | 0.05-1 (if used) |
| Azole-Containing Compound | 0.01-0.5 |
| Anionic Surfactant | 0.001-0.1 |
| Alkylamine Compound | 0.001-0.1 (if used) |

TABLE 1-continued

| Component | % By Weight of Composition |
| --- | --- |
| Organic Solvent | 0.1-1 |
| Abrasive (silica) | 0.1-12 |
| Oxidizer | 0.01-2 (if used) |
| Solvent (DI Water) | 75-99 |
| pH | 7-12 |

Example 1

Table 2 below shows the results of static etch rate (SER) tests comparing compositions that include an alkylamine having a 6-24 carbon alkyl chain, in line with Table 1 above, with compositions that do not include the alkylamine. All of the other components of the compositions were the exact same, with the exception of the amounts of water.

In the test, a coupon of the cobalt or tungsten metal was soaked in the described polishing composition at 60° C. for five minutes. The coupon is then rinsed with deionized water and dried under nitrogen. The pre-test and post-test thickness of the coupon is measured by using a four-point probe metrology tool to determine the static etching rate.

The results show that the addition of the alkylamine dramatically reduces the SER of tungsten, while not significantly influencing the cobalt SER. Thus, the alkylamine is an effective corrosion, or removal rate, inhibitor of tungsten.

| Example | pH | Oxidizer (wt. %) | Alkylamine | Co SER (Å/min) | W SER (Å/min) |
| --- | --- | --- | --- | --- | --- |
| Comp. Ex. 1 | 7.5 | 0.4 | No | 1.5 | 52.9 |
| Ex. 1 | 7.5 | 0.4 | Yes | 0.5 | 8.7 |
| Comp. Ex. 2 | 9 | 1 | No | 1.3 | 155.9 |
| Ex. 2 | 9 | 1 | Yes | 0 | 51.6 |

Example 2

Table 3 below shows the results of static etch rate (SER) tests comparing a composition that include only an anionic surfactant as a cobalt corrosion inhibitor with a composition that includes the anionic surfactant and a phosphonic acid compound having a molecular weight below 500 g/mol as a second cobalt corrosion inhibitor. Both compositions included the alkylamine compound used in Example 1. All of the other components of the compositions were the exact same.

The results show that the addition of the second cobalt corrosion inhibitor (phosphonic acid) does not significantly impact the cobalt SER, indicating that both compositions should protect cobalt and tungsten from corrosion about the same. Indeed, Table 3 shows that the cobalt removal rate is roughly the same for each of Example 3 and Comparative Example 3. However, the addition of the second cobalt corrosion inhibitor significantly reduces the Co-contact angle for the composition of Ex. 3, indicating that the composition is more able to wet the surface of cobalt than the composition of Comp. Ex. 3. The tungsten SER and tungsten contact angle measurements stay roughly the same upon the addition of the second cobalt corrosion inhibitor, indicating that the second cobalt corrosion inhibitor does not significantly interact with a tungsten surface. Comparative Example 4 shows that the low addition of the first cobalt corrosion inhibitor coupled with no second cobalt corrosion inhibitor results in an unacceptably high cobalt removal rate, due to lack of adequate cobalt protection. Comparative Example 5 shows an extremely high cobalt removal rate, which indicates that the second cobalt corrosion inhibitor on its own does not adequately protect cobalt.

TABLE 3

| Example | Anionic Surfactant | Phosphonic Acid | Co SER (ppb) | W SER (ppb) | Co - Contact Angle | W - Contact Angle | Co RR (Å/min) |
|---|---|---|---|---|---|---|---|
| Comp. Ex. 3 | 7.5X | No | 12 | 361 | 44.3° | 79.7° | 43 |
| Ex. 3 | 2.25X | 45X | 9 | 351 | 22.1° | 78.4° | 41 |
| Comp. Ex. 4 | 2.25X | No | 15 | 372 | 29.8° | 78.5° | 262 |
| Comp. Ex. 5 | No | 45X | 26 | 394 | 17.9° | 78.4° | 832 |

RR = Removal Rate

Example 3

Table 4 below shows Edge of Erosion (EoE) measurements after polishing patterned wafers including cobalt portions abutting to TEOS portions of the wafer. The EoE measurements indicate the erosion degree of the TEOS portion that abuts a cobalt portion of the wafer and is measured by Atomic Force Microscopy (AFM). The patterned wafers in this Example were polished using the first two polishing compositions detailed in Example 2, while the last two polishing compositions were not used because they had too high of cobalt removal rate (See Table 3), which would understandably lead to unacceptably high cobalt erosion.

The results show that Ex. 3, the composition that includes the second cobalt corrosion inhibitor, surprisingly demonstrated significantly reduced EoE when compared with Comp. Ex. 3. Without being bound by theory, the inventors believe that the unique synergism of the cobalt corrosion inhibitors of Ex. 3 allows for improved EoE due to the phosphonic acid based cobalt corrosion inhibitor having a significantly smaller molecular size when compared with the anionic surfactant. As these two molecules have affinity for the cobalt surface they dictate the surface chemistry of the cobalt portion of the wafer surface adjacent to the TEOS portion. This synergy is demonstrated by the change in contact angle shown in Table 3. When using only the larger anionic surfactant, as in Comp. Ex. 3, during polishing the abrasive can build up at the edge where the cobalt and TEOS meet because of the bulky surfactant covering, and reducing the wetting of, the cobalt portion and not the TEOS portion. This build up causes edge erosion of the TEOS due to the increased residence time for the abrasive at the edge. However, when the smaller phosphonic acid based cobalt corrosion inhibitor is included in the composition, the polishing composition can much more effectively wet the cobalt surface in addition to the TEOS surface, leading the abrasive to not build up as significantly at the interface of the cobalt and the TEOS. Thus, the erosion exhibited for Ex. 3 is significantly smaller than for the composition containing only the anionic surfactant as a cobalt corrosion inhibitor.

TABLE 4

| Pattern Density | Comp. Ex. 3 | Ex. 3 |
|---|---|---|
| 9 × 1 μm | 53 Å | 57 Å |
| 5 × 1 μm | 113 Å | 83 Å |
| 1.5 × 0.5 μm | 133 Å | 87 Å |
| 1 × 1 μm | 100 Å | 70 Å |

Although only a few example embodiments have been described in detail above, those skilled in the art will readily appreciate that many modifications are possible in the example embodiments without materially departing from this disclosure. Accordingly, all such modifications are intended to be included within the scope of this disclosure as defined in the following claims.

What is claimed:

1. A polishing composition comprising:
at least one abrasive;
at least one organic acid;
at least one anionic surfactant comprising at least a phosphate, and at least one of a hydrophobic 6 to 24 carbon alkyl chain and 2 to 16 ethylene oxide groups, wherein the anionic surfactant is in an amount of from about 0.001% to about 0.1% by weight of the composition;
at least one phosphonic acid compound having a molecular weight below 500 g/mol, wherein the at least one phosphonic acid is selected from the group consisting of phenylphosphonic acid, butylphosphonic acid, hexylphosphonic acid, benzylphosphonic acid, and mixtures thereof, wherein the phosphonic acid compound is in an amount of from about 0.05% to about 1% by weight of the composition;
at least one azole containing compound;
at least one alkylamine compound having a 10-24 carbon alkyl chain, wherein the alkylamine compound is in an amount of from about 0.001% to about 0.1% by weight of the composition; and
an aqueous solvent;
optionally, a pH adjuster.

2. The polishing composition of claim 1, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

3. The polishing composition of claim 1, wherein the at least one abrasive is in an amount of from about 0.01% to about 25% by weight of the composition.

4. The polishing composition of claim 1, wherein the at least one organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, maleic acid, nitrilotriacetic acid, ethylenediaminetetraacetic acid, diethylenetriaminepentaacetic acid, alanine, histidine, valine, phenylalanine, proline, glutamine, aspartic acid, glutamic acid, arginine, lysine, tyrosine, glycine, serine, asparagine, cysteine, leucine, isoleucine, methionine, threonine, tryptophan, benzoic acid, and mixtures thereof.

5. The polishing composition of claim 1, wherein there are at least two organic acids and one is an amino acid.

6. The polishing composition of claim 1, wherein the at least one organic acid is in an amount of from about 0.001% to about 2.5% by weight of the composition.

7. The polishing composition of claim 1, wherein the at least one anionic surfactant is selected from the group consisting of an alkyl phosphate, a polyoxyethylene alkyl ether phosphate, a polyoxyethylene aryl alkyl ether phosphate, a polyoxyethylene nonylaryl ether phosphate, a polyoxyethylene nonylphenyl ether phosphate, and mixtures thereof.

8. The polishing composition of claim 1, wherein the at least one azole is selected from the group consisting of benzotriazole, adenine, benzimidazole, thiabendazole, tolyltriazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, 5-methylbenzotriazole, 5-chlorobenzotriazole, 5-fluorobenzotriazole, 5-bromobenzotriazole, 5-iodobenzotriazole, 5-aminotetrazole, 5-ethylbenzotriazole, 5-butylbenzotriazole, dimethylbenzotriazole, dichlorobenzotriazole, chloromethylbenzotriazole, phenylbenzotriazole, benzylbenzotriazole, nitrobenzotriazole, imidazole, and combinations thereof.

9. The polishing composition of claim 1, wherein the at least one azole is in an amount of from about 0.001% to about 0.5% by weight of the composition.

10. The polishing composition of claim 1, wherein the pH of the composition is between about 7 to about 12.

11. The polishing composition of claim 1, further comprising:

an organic solvent in an amount of from about 0.01% to about 5% by weight of the composition.

12. The polishing composition of claim 11, wherein the organic solvent is selected from the group consisting of ethanol, 1-propanol, 2-propanol, n-butanol, propylene glycol, 2-methoxyethanol, 2-ethoxyethanol, propylene glycol propyl ether, ethylene glycol, and any combinations thereof.

13. A polishing composition comprising:

at least one abrasive in an amount of from about 0.1% to about 12% by weight of the composition;

at least two organic acids, in an amount of from about 0.001% to about 2.5% by weight of the composition, wherein at least one of the organic acids is an amino acid;

at least one anionic surfactant comprising at least a phosphate, and at least one of a hydrophobic 6 to 24 carbon alkyl chain and 2 to 16 ethylene oxide groups, wherein the anionic surfactant is in an amount of from about 0.001% to about 0.1% by weight of the composition;

at least one phosphonic acid compound having a molecular weight below 500 g/mol in an amount of from about 0.05% to about 1% by weight of the composition;

at least one azole containing compound in an amount of from about 0.01% to about 0.5% by weight of the composition;

at least one alkylamine compound having a 10-24 carbon alkyl chain in an amount of from about 0.001% to about 0.1% by weight of the composition; and an aqueous solvent;

wherein the pH of the composition is between about 7 to about 12.

* * * * *